United States Patent [19]
Wada et al.

[11] Patent Number: 4,907,203
[45] Date of Patent: Mar. 6, 1990

[54] SEMICONDUCTOR MEMORY DEVICE WITH CHANGEABLE WORD ORGANIZATION MODES INCLUDING A TEST MODE

[75] Inventors: Tomohisa Wada; Kenji Anami, both of Hyogo, Japan

[73] Assignee: Mitsubishi Denki Kabushiki Kaisha, Tokyo, Japan

[21] Appl. No.: 264,189

[22] Filed: Oct. 31, 1988

[30] Foreign Application Priority Data

Nov. 19, 1987 [JP] Japan .................. 62-293518

[51] Int. Cl.$^4$ .................................. G11C 7/00
[52] U.S. Cl. .................. 365/238.5; 365/201; 365/230.03; 365/189.03; 365/189.04; 364/900; 371/21.1
[58] Field of Search ........... 365/238, 201, 238.5, 365/230.05, 189.03, 230.06, 189.04, 230.03; 364/200, 900; 371/21.1

[56] References Cited

U.S. PATENT DOCUMENTS

| | | | |
|---|---|---|---|
| 4,354,256 | 10/1982 | Miyasaka | 365/238.5 |
| 4,667,285 | 5/1987 | Suzuki et al. | 364/900 |
| 4,763,304 | 9/1988 | Uesugi | 365/238.5 |

FOREIGN PATENT DOCUMENTS 61-39300  2/1986  Japan

OTHER PUBLICATIONS

Kayano et al. "25-nk 256K x 1 /64K x 4 CMOS SRAM's" IEEE Journal of Solid State Circuits, vol. SC-21, No. 5, Oct. 1986, pp. 686-691.

*Primary Examiner*—Stuart N. Hecker
*Assistant Examiner*—Alfonso Garcia
*Attorney, Agent, or Firm*—Lowe, Price, LeBlanc, Becker & Shur

[57] ABSTRACT

A semiconductor memory device comprises a memory cell array, a row decoder, a column decoder, a plurality of sense amplifiers, a plurality of write circuits, a signal switching circuit, a plurality of input buffers, a plurality of output buffers and a plurality of terminals, which are formed on the same chip. A switching signal B1/$\overline{B4}$ is applied to one of the plurality of terminals. The semiconductor memory device has a 256K word by 4 bit organization when the switching signal B1/$\overline{B4}$ is at an "L" level and has a 1M word by 1 bit organization when the switching signal B1/$\overline{B4}$ is at an "H" level. The word organization can be switched mainly by the signal switching circuit.

11 Claims, 16 Drawing Sheets

1M X 1 ORGANIZATION

256K X 4 ORGANIZATION

FIG.3A   PRIOR ART
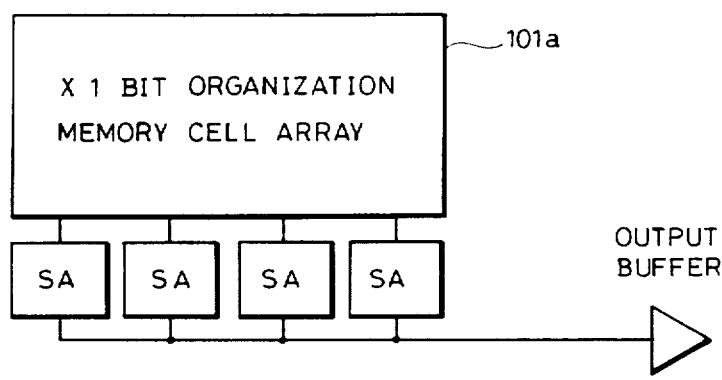
FIG.3B   PRIOR ART
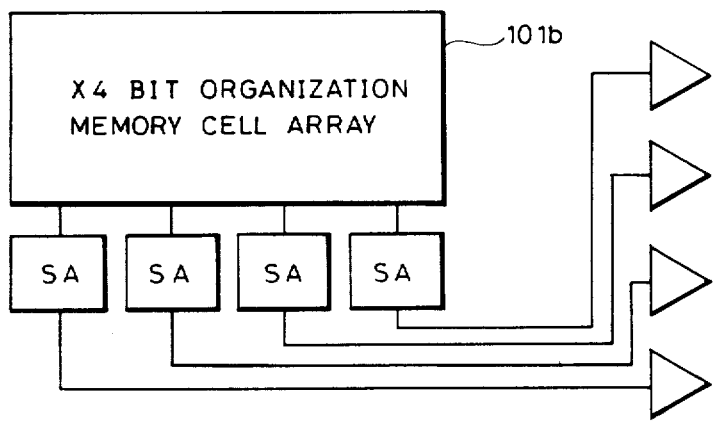
FIG.4
PRIOR ART
| 0 | 4 | 8 | 12 |
|---|---|---|----|
| 1 | 5 | 9 | 13 |
| 2 | 6 | 10 | 14 |
| 3 | 7 | 11 | 15 |

| (AT THE TIME OF X1) NAME OF PIN | (AT THE TIME OF X4) NAME OF PIN | | | (AT THE TIME OF X4) NAME OF PIN | (AT THE TIME OF X1) NAME OF PIN |
|---|---|---|---|---|---|
| A | A | 1 | 28 | Vcc | Vcc |
| A | A | 2 | 27 | A | A |
| A | A | 3 | 26 | A | A |
| A | A | 4 | 25 | A | A |
| A | A | 5 | 24 | A | A |
| A | A | 6 | 23 | A | A |
| NC | NC | 7 | 22 | A | A |
| A | A | 8 | 21 | B1/$\overline{B4}$ | B1/$\overline{B4}$ |
| A | A | 9 | 20 | A | A |
| A | A | 10 | 19 | DQ | A |
| A | A | 11 | 18 | DQ | A |
| Q | A | 12 | 17 | DQ | A |
| $\overline{W}$ | $\overline{CS}$ | 13 | 16 | DQ | D |
| Vss | Vss | 14 | 15 | $\overline{W}$ | $\overline{CS}$ |

(1M X 1 AND 256K X 4 ORGANIZATION)

SEMICONDUCTOR MEMORY DEVICE WITH CHANGEABLE WORD ORGANIZATION MODES INCLUDING A TEST MODE

BACKGROUND OF THE INVENTION

1. Field of the Invention

The present invention relates generally to semiconductor memory devices having changeable word organizations, and more particularly, to an improvement thereon wherein word organization changeover is carried out by on-chip logic circuitry.

2. Description of the Prior Art

FIG. 1 is a block diagram showing schematic structure of an example of a static random access memory (referred to as SRAM hereinafter).

A memory cell array 101 comprises a plurality of word lines, a plurality of bit line pairs arranged intersecting with the plurality of word lines, and a plurality of memory cells each arranged at each of intersections thereof. A row decoder 103 is responsive to address signals applied through a row address buffer 102 for selecting one of the plurality of word lines. A column decoder 105 is responsive to column address signals applied through a column address buffer 104 for selecting one of the plurality of bit line pairs. Data is read out or written from or to a memory cell at an intersection of the selected word line and the selected bit line pair. At the time of reading out data, the data stored in the memory cell selected in the above described manner is outputted through a data output buffer 107 by a read circuit 106. At the time of writing data, data externally applied to a data input buffer 109 is inputted to the memory cell selected in the above described manner by a write circuit 108.

FIGS. 2A and 2B are diagrams showing examples of pin arrangements in which static RAMs having a 1M word by 1 bit organization and a 256 K word by 4 bit organization are mounted, respectively.

In a static RAM shown in FIG. 2A, pins 1 to 6, pins 8 to 11, pins 17 to 20 and pins 22 to 27 are address input terminals receiving address signals A, and a pin 12 is a data output terminal for data Q. The pin 13 is a read/write control terminal receiving a read/write control signal $\overline{W}$. The read/write control signal $\overline{W}$ indicates write operation when the level thereof is an "L" level, and read operation when the level is an "H" level. A pin 14 is a ground terminal receiving a power-supply potential $V_{SS}$ (generally 0 V). A pin 15 is a chip selecting terminal receiving a chip selecting signal $\overline{CS}$. The chip selecting signal $\overline{CS}$ indicates a selected state when the level thereof is an "L" level and a non-selected state or a standby state when the level is an "H" level. A pin 16 is a data input terminal for data D. A pin 28 is a supply terminal receiving a power-supply potential $V_{CC}$ (generally 5 V). Pins 7 and 21 are terminals to which no connection is made.

In the static RAM shown in FIG. 2B, a pin 12 is an address signal input terminal, a pin 13 is a chip selecting terminal, a pin 15 is a write/read control terminal, and pins 16 to 19 are data input/output terminals. The other pins are the same as those in the static RAM shown in FIG. 2A.

If the conventional static RAM has different word organizations such as a 1M word by 1 bit organization and a 256K word by 4 bit organization, different devices having different pin arrangements, as shown in FIGS. 2A and 2B, are required.

In the RAM with 1M word by 1 bit organization, one of four data amplified by four sense amplifiers SA is read out through an output buffer, as shown in FIG. 3A.

On the other hand, in the RAM with 256K word by 4 bit organization, four data amplified by four sense amplifiers SA are read out simultaneously through four output buffer, as shown in FIG. 3B.

When the above described RAM is tested, 256K addresses must be selected to select all addresses in the 256K word by 4 bit organization, and 1M addresses must be selected in the 1M word by 1 bit organization. The test time period of the RAM with the 1M word by 1 bit organization is four times that of the RAM with the 256K word by 4 bit organization, in a test pattern referred to as an N pattern such as a march and a checkerboard, and is sixteen times that of the RAM with the 256K word by 4 bit organization, in a test pattern referred to as an $N^2$ pattern such as a galloping.

A test by the galloping pattern is performed in the following manner in the RAM having N capacity:

1 In FIG. 4, data "0" is written in all addresses. Therefore, N operations are required.

2 Data "1" is written in the address 0. Thus, one operation is required. Data are read out sequentially from the addresses $1 \rightarrow 0 \rightarrow 1$, $2 \rightarrow 0 \rightarrow 2$, ..., $N-1 \rightarrow 0 \rightarrow N-1$. In this case, $3(N-1)$ operations are required. Data "0" is written in the address 0. In this case, one operation is required.

3 The same operations as the above 2 are repeated increasing the address one by one.

Operations 1 and 3 are performed by inverting data "0" into data "1" and data "1" into data "0".

As a result, the following operations are required:

$$2 \times \{N + N[3(N-1)+2]\} = 6N^2$$

Thus, assuming that a cycle time is 25 ns, a test time period $(6N^2)T$ is as follows in the case of the RAM with 1M word by 1 bit organization:

$$T = 25[ns] \times 6 \times (1 \times 2^{20})^2$$
$$\approx 46[hours]$$

On the other hand, in the case of the RAM with 256K word by 4 bit organization, a test time period is one sixteenth of that of the RAM with 1M word by 1 bit, that is, about three hours.

Thus, even if the RAM with the 1M word by 1 bit organization and the RAM with the 256K word by 4 bit organization have the same memory capacity such as 1M bits, the test time period depends on the word structure.

A 256K × 1/64K × 4 word organization is changed by exchanging photomasks in an aluminum process, which is described in an article entitled "25-ns 256K × 1/64K × 4 CMOS SRAM's", IEEE Journal of Solid State Circuits, vol. SC-21, No. 5, Oct. 1986, pp. 686–691. In addition, the test time period is reduced by grouping memory cells, which is disclosed in Japanese Patent Laying-Open Gazette No. 39300/1986.

Since the conventional semiconductor memory device had the above described structure, the test time period was significantly changed depending on the word organization even in devices having the same memory capacity. Particularly, a semiconductor memory device with a 1-bit organization such as a 1M word by 1 bit organization requires the longest test time period.

Additionally, semiconductor memory devices having different word organizations are formed as different devices. Thus, in order to change the word organization of the semiconductor memory device, the semiconductor memory device must be replaced with a different device having a different word organization. Further, different chips must be obtained and kept in inventory. Also the chips require dual characteristics to be not perfectly matched.

SUMMARY OF THE INVENTION

One object of the invention is to provide a semiconductor memory device having a changeable word organization.

Another object of the invention is to provide a semiconductor memory device having a word organization that can be changed without requiring additional masking steps for providing the different organizations.

A further object is to provide a semiconductor memory device that is operable selectively with different word organizations depending upon particular circuit applications of the memory.

A still further object is to provide a semiconductor memory device that is operable selectively with one word organization for a particular circuit application and with another organization for testing.

A further object is to provide a semiconductor memory device operable with different word organizations that requires no additional manufacturing steps.

An additional object of the invention is to reduce the test time of memory circuit arrays.

A still further object of the invention is to reduce the number of different kinds of integrated circuit chips that must be maintained in inventory as a result of different word organization requirements.

Another object is to reduce the time required to test a semiconductor memory device without requiring additional pins for testing.

Another object of the invention is to provide semiconductor memory devices having different word organizations but virtually identical operating characteristics.

In order to attain the above described objects, a semiconductor memory device according to the present invention comprises a semiconductor chip; a plurality of terminals formed on the chip for receiving or generating data and address signals, the memory device operable selectively in a first word organization mode defined by a first predetermined arrangement of function's of the terminals and in a second word organization ,mode defined by a second predetermined arrangement of functions of the terminals; means for receiving a word organization mode selection signal; and signal flow path control circuitry on the chip and responsive to the word organization mode selection signal for operating the chip, selectively, in the first or second word organization mode.

In accordance with another aspect of the present invention, for a semiconductor memory device, comprising: a semiconductor chip; a plurality of terminals formed on the chip for receiving or generating data and address signals, the memory device operable selectively in a first word organization mode defined by a first predetermined arrangement of functions of the terminals together with a first word length and in a second word organization mode defined by a second predetermined arrangement of functions of the terminals together with a second word length longer than the first word length; means for receiving a word organization mode selection signal; and signal flow path control circuitry on the chip and responsive to the word organization mode selection signal for operating the chip, selectively, in the first or second word organization mode, wherein the semiconductor memory device is operable in normal and testing modes of operation; an operating method, comprising the steps of: during the normal mode of operation of the semiconductor device, generating a first word organization mode selection signal corresponding to the first word length; during the testing mode of operation of the semiconductor device, generating the second word organization mode selection signal; and applying the first or second word organization mode selection signal so generated to the word organization mode selection signal receiving means.

In accordance with further aspect of the present invention, the semiconductor memory device comprises a semiconductor chip, a plurality of memory cells formed on the semiconductor chip, a plurality of terminals formed on the semiconductor chip and receiving data and address signals, first processing means, second processing means, switching signal generating means formed on the semiconductor chip for generating a switching signal, and signal switching means. The first processing means is formed on the semiconductor chip and comprises the first number of address input portions receiving the address signals through some of the plurality of terminals and the second number of data receiving portions receiving the data, which is responsive to signals applied to the address input portions for selecting the second number of memory cells, of the plurality of memory cells and writing the data applied to the data receiving portions to the selected memory cells or reading out the data stored in the selected memory cells to the data receiving portions. The second processing means is formed on the semiconductor chip and comprises the third number of address input portions receiving the address signals through some of the plurality of terminals and the fourth number of data receiving portions receiving the data, which is responsive to the address signals applied to the address input portions for selecting the fourth number of memory cells, of the plurality of memory cells and writing the data applied to the data receiving portions to the selected memory cells or reading out the data stored in the selected memory cells to the data receiving portions. The signal switching means is formed on the semiconductor chip and responsive to a first state of the switching signal generated by the switching signal generating means for coupling the address input portions and the data receiving portions in the first processing means to a predetermined terminal, of the plurality of terminals, and responsive to a second state of the switching signal generated by the switching signal generating means for coupling the address input portions and the data receiving portions in the second processing means to a predetermined terminal, of the plurality of terminals.

In the semiconductor memory device according to the present invention, data are inputted and outputted by the second number of data receiving portions when the switching signal generated by the switching signal generating means is in the first state, and data are inputted and outputted by the fourth number of data receiving portions when the switching signal generated by the switching signal generating means is in the second state. Thus, since the word organization can be changed by the switching signal, the test time period can be reduced.

As described in the foregoing, according to the present invention, since a semiconductor memory device in which the word organization can be switched by a switching signal is obtained, the test time period can be reduced. In addition, since a plurality of semiconductor memory devices having different word organizations can be replaced with a single device, the present invention has a large advantage for standardization. In addition, since the word organization can be changed at the time of write operation and read operation, a new function can be provided to an applied equipment using a semiconductor memory.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a diagram for explaining an operation of the RAM with 1M word by 1 bit organization;

FIG. 3B is a diagram for explaining an operation of the RAM with 256K word by 4 bit organization;

FIG. 4 is a diagram for explaining a test by galloping pattern;

DESCRIPTION OF THE PREFERRED EMBODIMENTS

Figure 1:
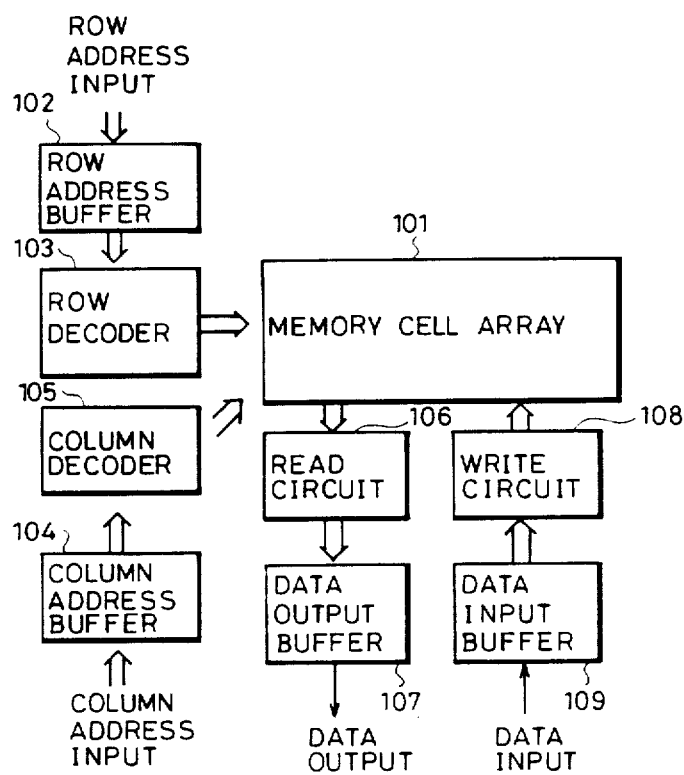
FIG. 1 is a block diagram showing schematic structure of an example of a SRAM.
Figure 2A:
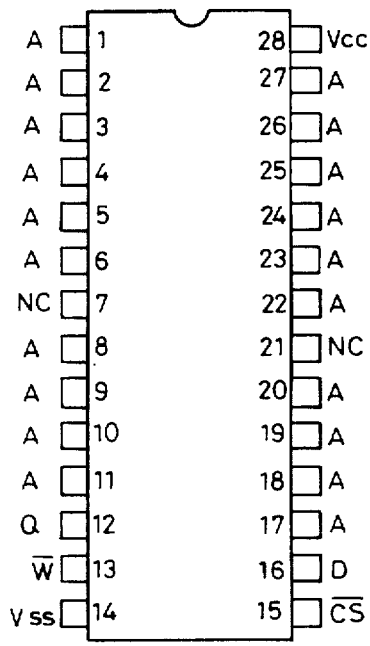
FIG. 2A is a diagram showing a pin arrangement of a conventional semiconductor memory device with a 1M word by 1 bit organization.
Figure 2B:
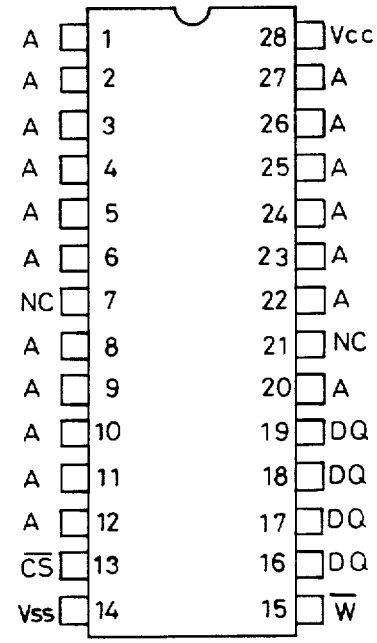
FIG. 2B is a diagram showing a pin arrangement of a conventional semiconductor memory device with a 256K word by 4 bit organization.
Figure 5:
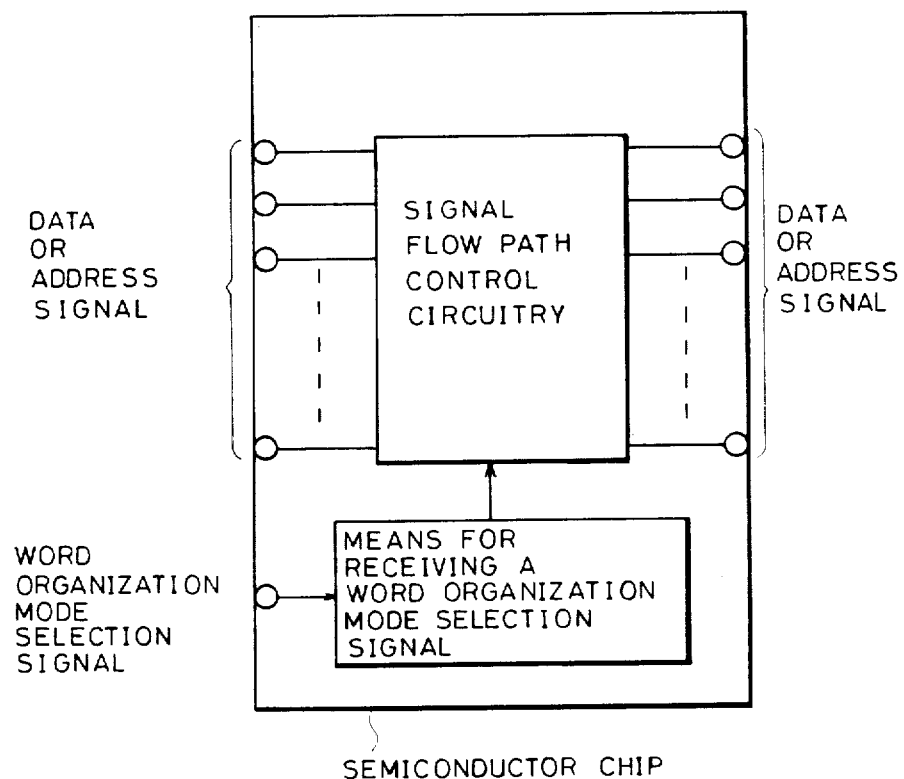
FIG. 5 is a block diagram corresponding to the present invention of claim 1.

FIG. 5 shows a block diagram corresponding to the semiconductor memory device according to the present invention.

Referring now to the drawings, embodiments of the present invention are described.

Figures 6, 6A:
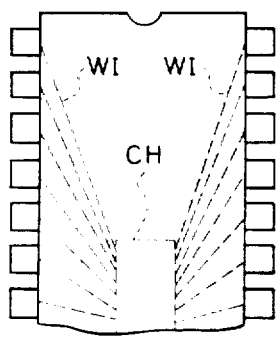
FIG. 6 is a diagram showing pin arrangements of a semiconductor memory device according to an embodiment of the present invention.
FIG. 6A is a diagram showing a connection between pins in a package and a semiconductor chip by a bonding wire.

FIG. 6 is a diagram showing a pin arrangement of a semiconductor memory device according to an embodiment of the present invention in which the device is mounted on a package.

The semiconductor memory device can be changed to a 1M word by 1 bit organization and a 256K word by 4 bit organization. Address signals A are applied to pins 1 to 6, pins 8 to 11, a pin 20, pins 22 to 27 at the time of the 1M word by 1 bit organization (referred to as the time of the ×1 organization hereinafter) and at the time of the 256K word by 4 bit organization (referred to as the time of the ×4 organization hereinafter). A ground potential $V_{SS}$ (generally 0 V) is applied to a pin 14 at the time of the ×1 organization and at the time of the ×4 organization. A power-supply potential $V_{CC}$ (generally 5 V) is applied to a pin 28 at the time of the ×1 organization and at the time of the ×4 organization. Data Q is outputted to a pin 12 at the time of the ×1 organization and the address signal A is applied to the same at the time of the ×4 organization. A write/read control signal $\overline{W}$ is applied to a pin 13 at the time of the ×1 organization and a chip selecting signal $\overline{CS}$ is applied to the same at the time of the ×4 organization. A chip selecting signal $\overline{CS}$ is applied to a pin 15 at the time of the ×1 organization and a read/write control signal $\overline{W}$ is applied to the same at the time of the ×4 organization. Data D is applied to a pin 16 at the time of the ×1 organization and data D is applied or data Q is outputted to the same at the time of the ×4 organization. Address signals A are applied to pins 17 to 19 at the time of the ×1 organization and data D is applied or data Q is outputted to the same at the time of the ×4 organization. A switching signal B1/$\overline{B2}$ is applied to a pin 21 at the time of the ×1 organization and at the time of the ×4 organization.

In the semiconductor memory device, a function of each of the pins is switched such that the ×4 organization is used when the switching signal B1/$\overline{B4}$ is at an "L" level and the ×1 organization is used when the switching signal B1/$\overline{B4}$ is at an "H" level.

In the semiconductor memory device according to the present embodiment, circuits as described below are formed on the same semiconductor chip CH and a plurality of pads on the semiconductor chip CH are connected to the pins 1 to 28 in the package shown in FIG. 6 by boarding wires WI, as shown in FIG. 6A.

Figure 7A:
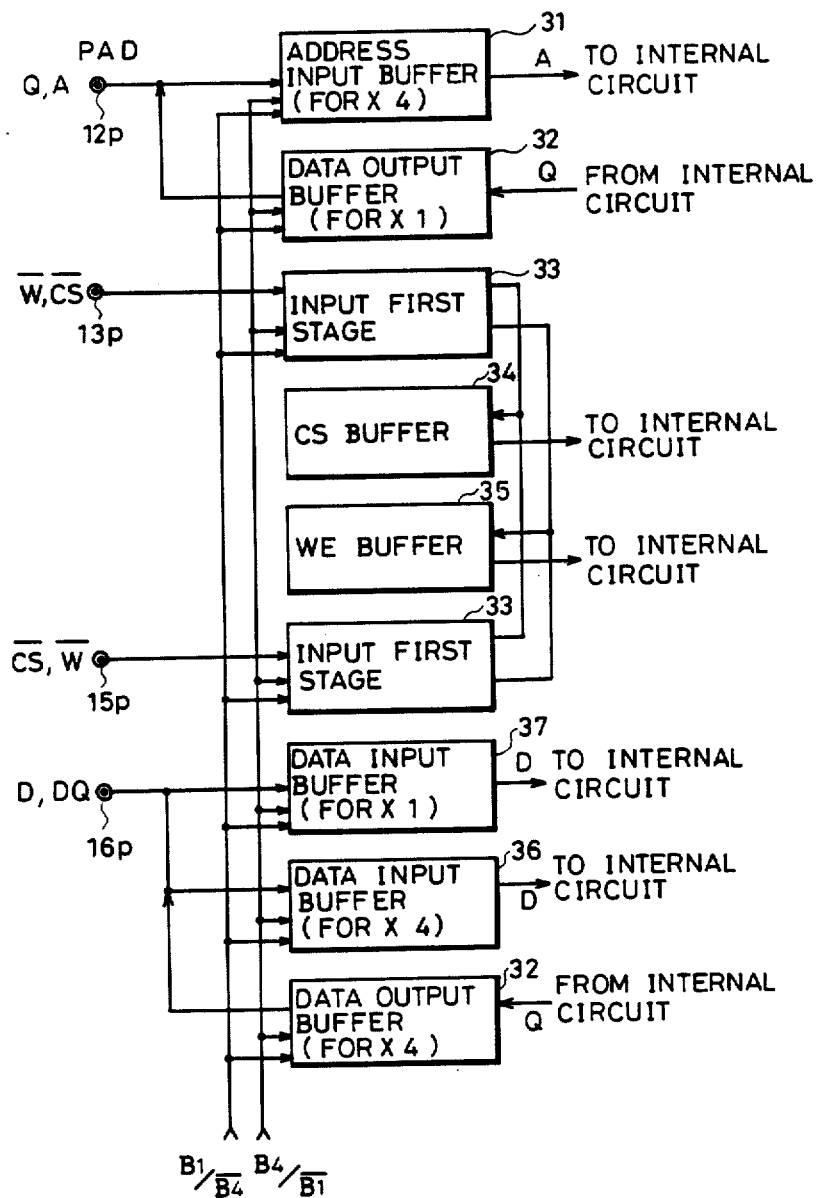
FIG. 7A is a block diagram showing means for switching functions of pins 12, 13, 15 and 16 shown in FIG. 6.
Figure 7B:
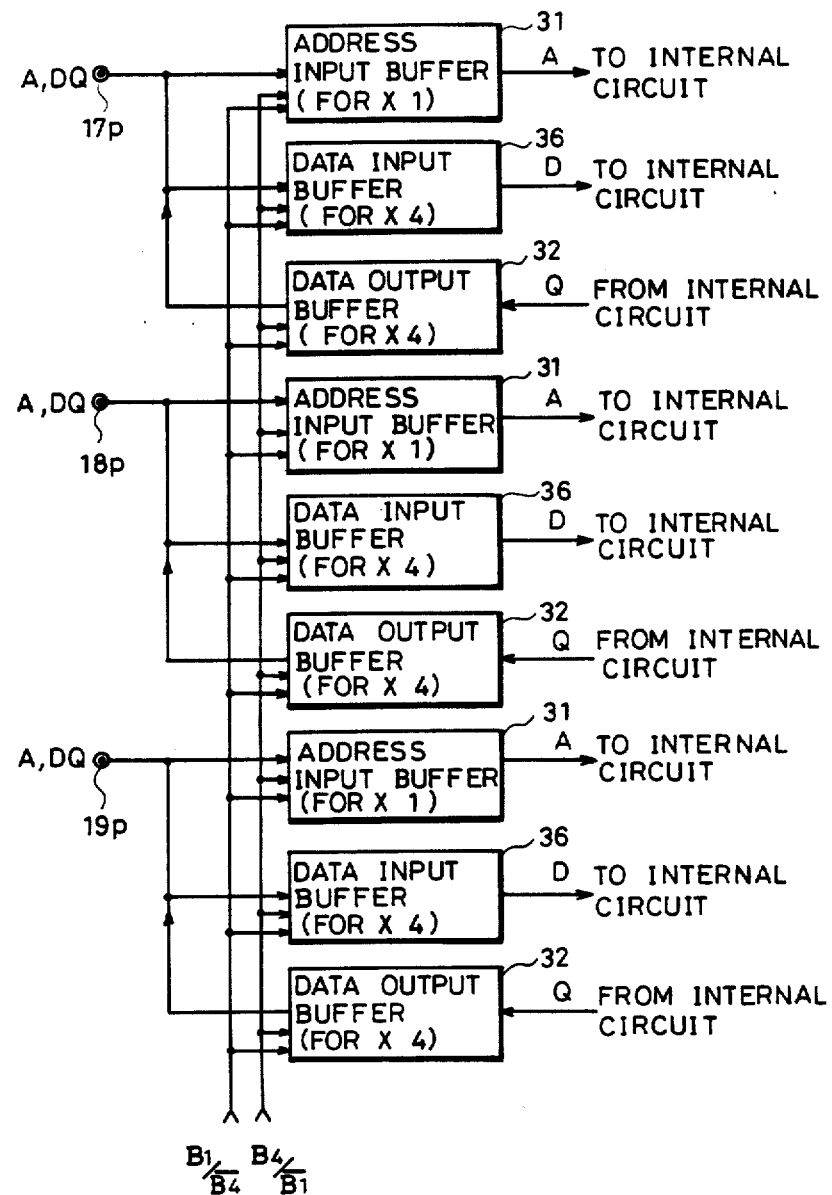
FIG. 7B is a block diagram showing means for switching functions of pins 17 to 19 shown in FIG. 6.

FIGS. 7A and 7B are block diagrams showing means for switching functions of the pins 12, 13, 15, 16 and 17 to 19.

Referring to FIGS. 7A and 7B, pads 12p, 13p, 15p, 16p, 17p, 18p and 19p are connected to the pins 12, 13, 15, 16, 17, 18 and 19 shown in FIG. 6, respectively.

An address input buffer 31 and a data output buffer 32 are connected to the pad 12p. A switching signal B1/$\overline{B4}$ and an inverted switching signal $\overline{B1}$/B4 which is an inverted signal of the switching signal B1/$\overline{B4}$ are applied to the address input buffer 31 and the data output buffer 32. When the switching signal B1/$\overline{B4}$ is at an "L" level, an address signal A applied to the pad 12p is transmitted to an internal circuit through the address input buffer 31. When the switching signal B1/$\overline{B4}$ is at an "H" level, data Q applied from the internal circuit is transmitted to the pad 12p through the data output buffer 32.

Input first stages 33 are connected to the pads 13p and 15p, respectively. A CS buffer 34 and a WE buffer 35 are connected to respective two outputs of the input first stages 33. The switching signal B1/$\overline{B4}$ and the inverted switching signal B4/$\overline{B1}$ are applied to the input first stages 33. When the switching signal B1/$\overline{B4}$ is at the "L" level, a chip selecting signal $\overline{CS}$ applied to the pad 13p is applied to the CS buffer 34 through the input first stage 33. The chip selecting signal $\overline{CS}$ is further transmitted to the internal circuit. A write/read control signal $\overline{W}$ applied to the pad 15p is applied to the WE buffer 35 through the input first stage 33. The write/read control signal $\overline{W}$ is further transmitted to the internal circuit. On the other hand, when the switching signal B1/$\overline{B4}$ is at the "H" level, a write/read control signal $\overline{W}$ applied to the pad 13p is transmitted to the internal circuit through the input first stage 33 and the WE buffer 35. A chip selecting signal $\overline{CS}$ applied to the pad 15p is transmitted to the internal circuit through the input first stage 33 and the CS buffer 34.

A data input buffer 37 for a ×1 organization, a data input buffer 36 and a data output buffer 32 for a ×4 organization are connected to the pad 16p. The switching signal B1/$\overline{B4}$ and the inverted switching signal B4/$\overline{B1}$ are applied to the data input buffers 37 and 36 and the data output buffer 32. When the switching signal B1/$\overline{B4}$ is at the "L" level, data D applied to the pad 16p is transmitted to the internal circuit through the data input buffer 36 for the ×4 organization or data Q applied from the internal circuit is transmitted to the pad 16p through the data output buffer 32. When the switching signal B1/$\overline{B4}$ is at the "H" level, data D applied to the pad 16p is transmitted to the internal circuit through the data input buffer 37 for the ×1 organization.

An address input buffer 31, a data input buffer 36 and a data output buffer 32 are connected to the pad 17p. The switching signal B1/$\overline{B4}$ and the inverted switching signal B4/$\overline{B1}$ are applied to the address input buffer 31, the data input buffer 36 and the data output buffer 32. When the switching signal B1/$\overline{B4}$ is at the "L" level, data D applied to the pad 17p is transmitted to the internal circuit through the data input buffer 36 or data Q applied 25 from the internal circuit is transmitted to the pad 17p through the data output buffer 32. When the switching signal B1/$\overline{B4}$ is at the "H" level, an address signal A applied to the pad 17p is transmitted to the internal circuit through the address input buffer 31.

Circuits connected to the pads 18p and 19p are the same as that connected to the pad 17p.

Figure 8:
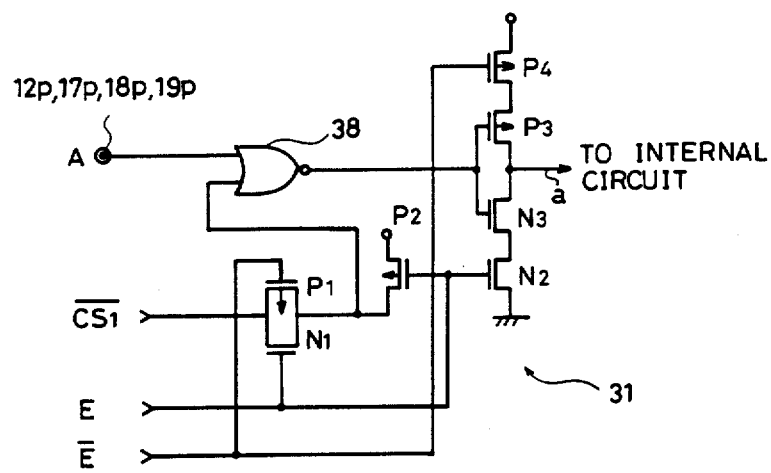
FIG. 8 is a circuit diagram of an address input buffer shown in FIGS. 7A and 7B.

FIG. 8 is a circuit diagram of the address signal input buffer 31 shown in FIGS. 7A and 7B.

The address signal input buffer 31 comprises n channel transistors N1, N2 and N3, p channel transistors P1, P2, P3 and P4 and an NOR circuit 38. The NOR circuit 38 has one input terminal receiving an address signal A and other input terminal receiving a chip selecting signal $\overline{CS1}$ through a transfer gate comprising the transistors N1 and P1. The chip selecting signal $\overline{CS1}$ is generated in a chip in response to a chip selecting signal $\overline{CS}$ externally applied. In addition, a first control signal E activates the address signal input buffer 31 when it is at an "H" level and inactivates the same when it is at an "L" level. Furthermore, a second control signal $\overline{E}$ is an inverted signal of the first control signal E. The first and second control signals E and $\overline{E}$ are coupled to either of the switching signal B1/$\overline{B4}$ and the inverted switching signal B4/$\overline{B1}$. When the first control signal E is at the "L" level, the second control signal $\overline{E}$ attains the "H" level, so that the transistors N1 and P1 are turned off and the transistor P2 is turned on. Thus, since a signal at the "H" level is applied to the other input terminal of the NOR circuit 38, an output of the NOR circuit 38 is fixed at the "L" level. More specifically, the output of the NOR circuit 38 is not affected by the address signal A. At that time, since the transistors N2 and P4 are turned off, a node a connected to an internal circuit is rendered to be floating.

Figure 9:
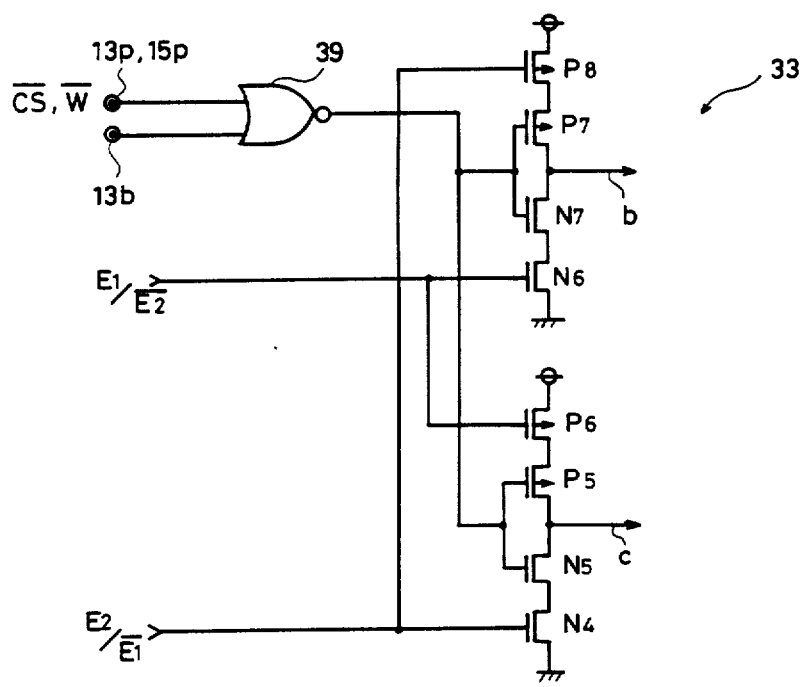
FIG. 9 is a circuit diagram of an input first stage shown in FIG. 7A.

FIG. 9 is a circuit diagram of the input first stage 33 shown in FIG. 7A.

The input first stage 33 comprises an NOR circuit 39, n channel transistors N4, N5, N6 and N7 and p channel transistors P5, P6, P7 and P8. The NOR circuit 39 has one input terminal receiving a chip selecting signal $\overline{CS}$ or a write/read control signal $\overline{W}$ and other input terminal receiving a signal in a chip, such as $\overline{CS1}$ as shown in FIG. 8 or a fixed potential. A first selecting signal E1/$\overline{E2}$ and a second selecting signal E2/$\overline{E1}$ are complementary signals and coupled to either of the switching signal B1/$\overline{B4}$ and the inverted switching signal B4/$\overline{B1}$. When the first selecting signal E1/$\overline{E2}$ is at an "H" level, the transistors N6 and P8 are turned on and the transistors N4 and P6 are turned off, so that a signal obtained by inverting an output of the NOR circuit 39 is provided to a node b, whereby a node c is rendered to be floating. When the first selecting signal E1/$\overline{E2}$ is at an "L" level, the node b is rendered to be floating, so that the signal obtained by inverting the output of the NOR circuit 39 is provided to the node c. Thus, the inverted signal of the output of the NOR circuit 39 is provided to the node b or c in response to the first selecting signal E1/$\overline{E2}$ and the second selecting signal E2/$\overline{E1}$.

Figure 10:
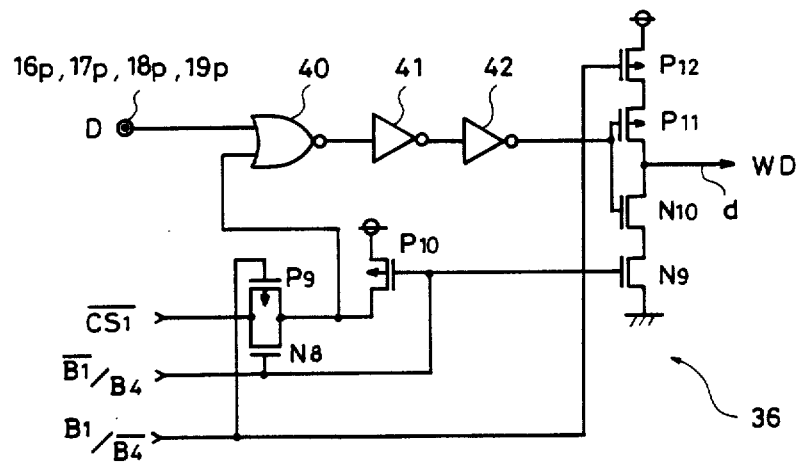
FIG. 10 is a circuit diagram of a data input buffer for a ×4 organization shown in FIGS. 7A and 7B.

FIG. 10 is a circuit diagram of the data input buffer 36 for the ×4 organization shown in FIGS. 7A and 7B.

The data input buffer 36 for the ×4 organization comprises an NOR circuit 40, inverters 41 and 42, n channel transistors N8, N9 and N10 and p channel transistors P9, P10, P11 and P12. The NOR circuit 40 has one input terminal receiving data D through a pad 16p, 17p, 18p or 19p and other input terminal receiving a chip selecting signal $\overline{CS1}$ through a transfer gate comprising the transistors N8 and P9. A switching signal B1/$\overline{B4}$ and an inverted switching signal $\overline{B1}$/B4 are complementary signals. The switching signal B1/$\overline{B4}$ corresponds to the ×1 organization when it is at an "H" level and corresponds to the ×4 organization when it is at an "L" level. When the switching signal B1/$\overline{B4}$ is at the "H" level, the inverted switching signal $\overline{B1}$/B4 is at the "L" level, so that the transistors N8, P9, N9 and P12 are turned off and the transistor P1 is turned on. Thus, an output of the NOR circuit 40 is fixed at the "L" level and a buffer output WD from a node d is rendered to be floating. On the other hand, when the switching signal B1/$\overline{B4}$ is at the "L" level, the inverted switching signal $\overline{B1}$/B4 is at the "H" level, so that the transistors N8, P9, N9 and P12 are turned on and the transistor P10 is turned off. Thus, the output of the NOR circuit 40 changes depending on the change of a data input and the buffer output WD follows the change. More specifically, the data input buffer 36 for the ×4 organization is activated only when the switching signal B1/$\overline{B4}$ is at the "L" level. Four data input buffers 36 for the ×4 organization are provided in a chip, so that four buffer outputs WD are obtained at the time of the ×4 organization.

Figure 11:
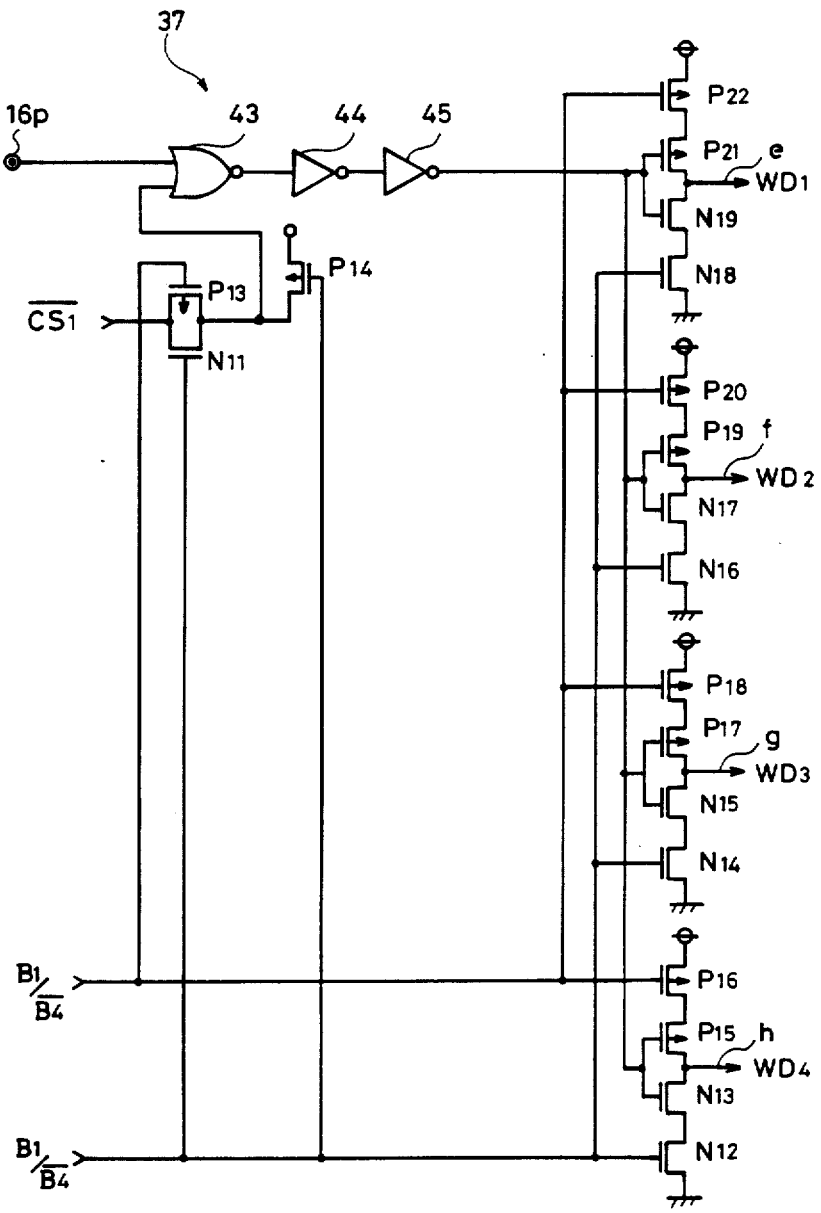
FIG. 11 is a circuit diagram of a data input buffer for a ×1 organization shown in FIG. 7A.

FIG. 11 is a circuit diagram of the data input buffer 37 for the ×1 organization shown in FIG. 7A.

The data input buffer 37 for the ×1 organization comprises an NOR circuit 43, inverters 44 and 45, n channel transistors N11 to N19 and p channel transistors P13 to P22, similarly to the data input buffer 36 for the ×4 organization. The data input buffer 37 for the ×1 organization is the same as the data input buffer 36 for the ×1 organization except that the switching signal B1/$\overline{B4}$ and the inverted switching signal $\overline{B1}$/B4 are connected in an opposite manner, and four buffer outputs WD1, WD2, WD3 and WD4 are obtained from an output of the inverter 45 to nodes e, f, g and h. The data input buffer 37 for the ×1 organization is activated when the switching signal B1/$\overline{B4}$ is at an "H" level, that is, at the time of the ×1 organization.

Figure 12:
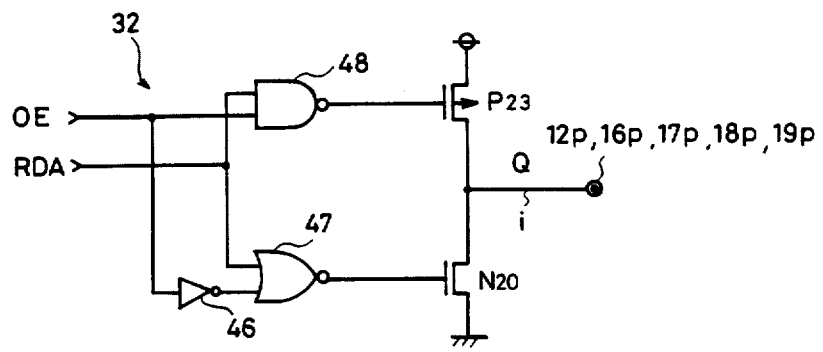
FIG. 12 is a circuit diagram of a data output buffer shown in FIGS. 7A and 7B.

FIG. 12 is a circuit diagram of the data output buffer 32 shown in FIGS. 7A and 7B.

The data output buffer 32 comprises an inverter 46, an NOR circuit 47, an NAND circuit 48, an n channel transistor N20 and a p channel transistor P23. When an output buffer control signal OE is at an "L" level, an output of the NAND circuit 48 attains an "H" level, and an output of the NOR circuit 47 attains the "L" level, so that the transistors N20 and P23 are turned off. Thus, a node i is rendered to be floating, that is, enters a high impedance state. On the other hand, when the output buffer control signal OE is at the "H" level, data RDA applied from a memory cell is inverted by the NAND circuit 48 and the NOR circuit 47 and transmitted to gates of the transistors P23 and N20. Thus, an output from the node i changes in response to the data RDA. The node i is connected to the pad 12p, 16p, 17p, 18p or 19p. The same data output buffers 32 are used for the ×1 organization and the ×4 organization. At the time of the ×1 organization, the output buffer control signal OE applied to the output buffer 32 for the ×1 organization is forced to be the "H" level and the output buffer control signal OE applied to the data output buffer 32 for the ×4 organization is forced to be the "L" level. At the time of the ×4 organization, an operation contrary to the above described operation is performed. As a result, the data output buffer 32 to be activated can be switched at the time of the ×1 organization and at the time of the ×4 organization.

Figure 13:
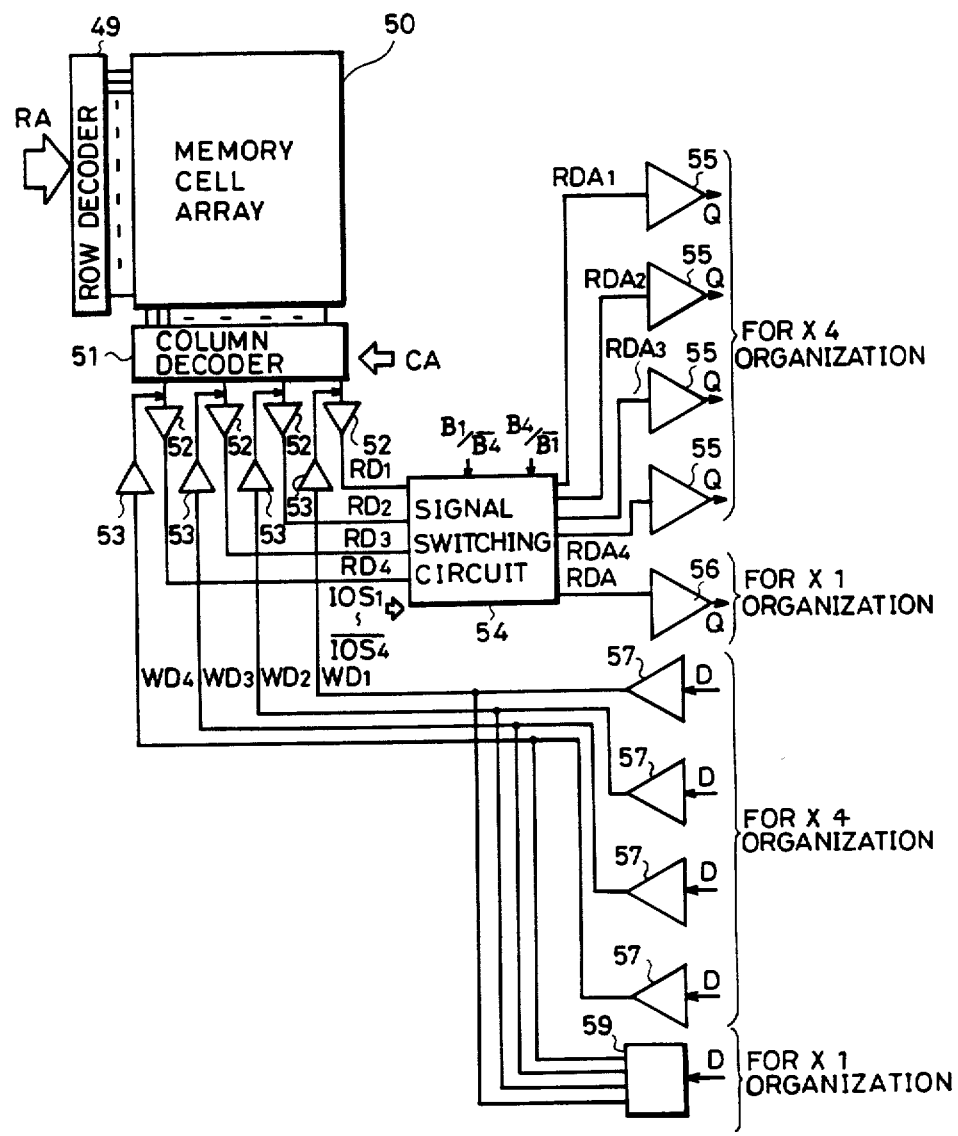
FIG. 13 is a block diagram showing a structure of an internal circuit of the semiconductor memory device according to the embodiment shown in FIG. 6.

FIG. 13 is a block diagram showing an internal circuit of a semiconductor memory device according to the present embodiment.

A memory cell array 50 comprises a plurality of memory cells arranged in a plurality of rows and columns. A row decoder 49 is responsive to a plurality of address signals RA applied through a plurality of address input buffers for selecting one row of the memory cell array 50. A column decoder 51 is responsive to a plurality of address signals CA applied through a plurality of address input buffers for selecting four columns of the memory cell array 50. At the time of read operation, four sense amplifiers 52 detect and amplify data read out from four memory cells selected by the row decoder 49 and the column decoder 51 and applies the same to a signal switching circuit 54 through read data buses RD1 to RD4. The signal switching circuit 54 is responsive to a switching signal B1/B4 and an inverted switching signal B4/B1 for switching a connection of the read data buses to a ×4 organization or a ×1 organization. At the time of the ×4 organization, four data read out to the read data buses RD1 to RD4 are applied to four data output buffers 55 for the ×4 organization through read data buses RDA1 to RDA4. At the time of the ×1 organization, any of the data read out to the read data buses RD1 to RD4 are applied to a data output buffer 56 for the ×1 organization through a read data bus RDA in response to selecting signals $\overline{IOS1}$ to $\overline{IOS4}$. The selecting signals $\overline{IOS1}$ to $\overline{IOS4}$ are generated from two bits of address signals A.

At the time of write operation, data are applied to four data input buffers 57 or a data input buffer 59. At the time of the ×4 organization, four data applied to the four data input buffers 57 are inputted to four write circuits 53 through write data buses WD1 to WD4, respectively. The four data are written to four memory cells selected by the row decoder 49 and the column decoder 51. At the time of the ×1 organization, data applied to the data input buffer 59 is inputted to the four write circuits 53 through the four write data buses WD to WD4. One of the four data is selected by two bits of the address signals A. The data is written to a memory cell selected by the row decoder 49 and the column decoder 51.

Figure 14:
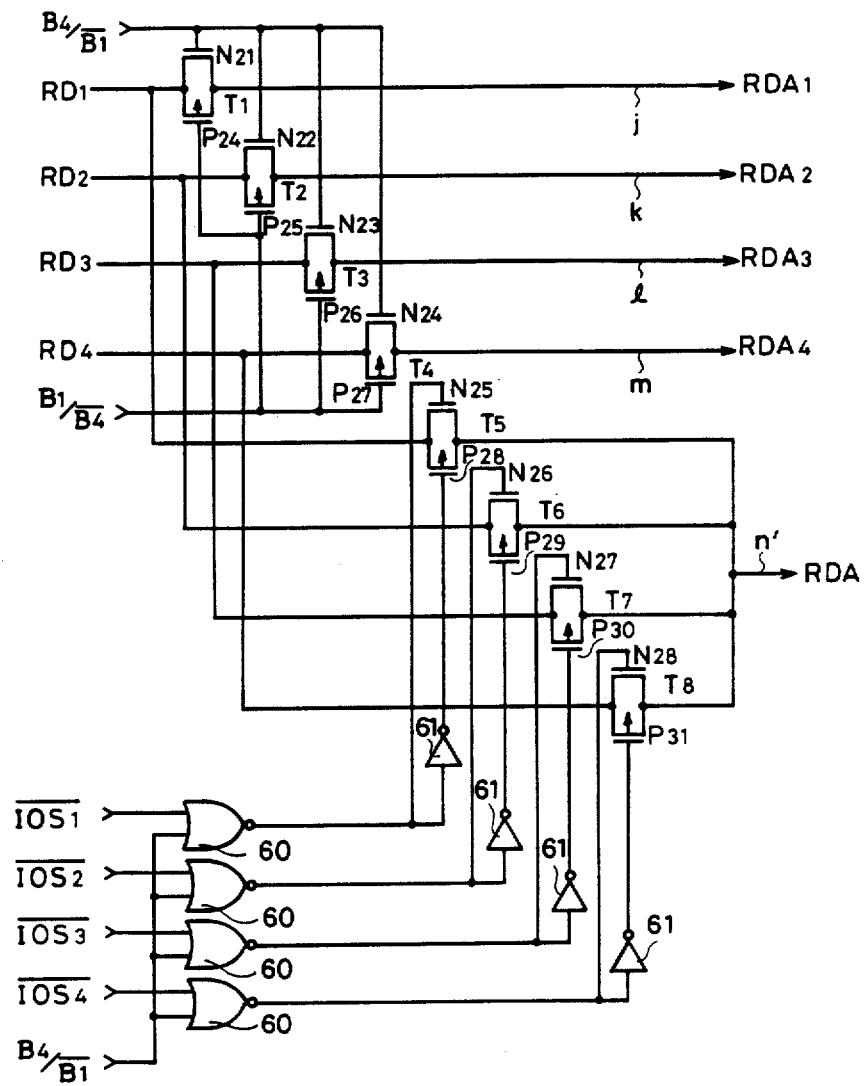
FIG. 14 is a circuit diagram of a signal switching circuit shown in FIG. 13.

FIG. 14 is a circuit diagram showing a structure of the signal switching circuit 54 shown in FIG. 13.

The signal switching circuit 54 comprises four NOR circuits 60, four inverters 61, n channel transistors N21 to N28 and p channel transistors P24 to P31. The transistors N21 to N28 and the transistors P24 to P31 constitute eight transfer gates T1 to T8. The four NOR circuits 60 have respective one input terminals receiving a common inverted switching signal B4/$\overline{B1}$. The four NOR circuits 60 have respective other input terminals receiving selecting signals $\overline{IOS1}$ to $\overline{IOS4}$, respectively. Read data buses RD1 to RD4 are connected to read data buses RDA1 to RDA4 through the transfer gates T1 to T4, respectively. In addition, the read data buses RD1 to RD4 are connected to a common read data bus RDA through the transfer gates T5 to T8, respectively. The transfer gates T1 to T4 have respective one gates receiving the inverted switching signal B4/$\overline{B1}$ and respective other gates receiving a switching signal B1/$\overline{B4}$. Furthermore, the transfer gates T5 to T8 have respective one gates receiving output signals of the four NOR circuits 60, respectively, and respective other gates receiving signals obtained by inverting the output signals of the four NOR circuits 60 by the inverters 61, respectively.

When the switching signal B1/$\overline{B4}$ is at an "L" level and the inverted switching signal B4/$\overline{B1}$ is at an "H" level, the transistors N21 to N24 and the transistors P24 to P27 are turned on, and the transistors N25 to N28 and the transistors P28 and P31 are turned off because the outputs of the NOR circuits 60 attain the "L" level.

Thus, the read data buses RD1 to RD4 are connected to the read data buses RDA1 to RDA4 through the transistors T1 to T4, respectively.

On the other hand, when the switching signal B1/$\overline{B4}$ is at the "H" level and the inverted switching signal B4/$\overline{B1}$ is at the "L" level, the transistors N21 to N24 and the transistors P24 to P27 are turned off. In addition, one of the outputs of the NOR circuits 60 attains the "H" level in response to the selecting signals $\overline{IOS1}$ to $\overline{IOS2}$, so that one of the transfer gates T5 to T8 is turned on. Therefore, one of the read data buses RD1 to RD4 is connected to the read data bus RDA through the transfer gate.

Figure 15:
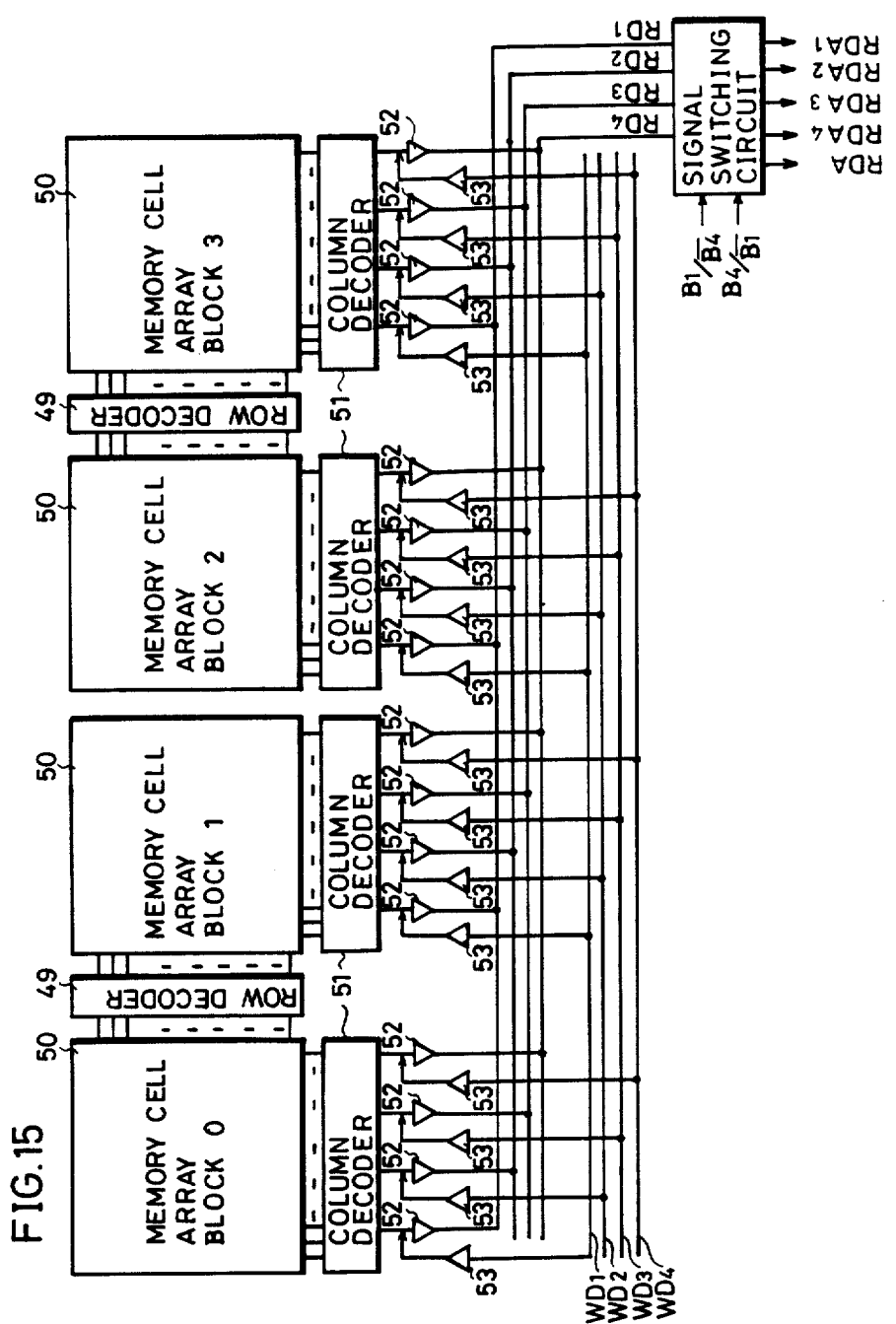
FIG. 15 is a block diagram showing a structure of an internal circuit in a semiconductor memory device according to another embodiment of the present invention.

FIG. 15 is a block diagram showing a semiconductor memory device according to another embodiment of the present invention.

The semiconductor memory device comprises four memory cell array blocks 50. The portions identical or corresponding to those in the embodiment shown in FIG. 13 have the same reference numerals. As in the embodiment shown in FIG. 13, four sense amplifiers 52 and four write circuits 53 are connected to each of the memory cell array blocks 50 through a column decoder 51. Corresponding ones of the sense amplifiers 52 connected to the four memory cell array blocks 50 are connected to the same one of read data buses RD1 to RD4, respectively. Corresponding ones of the read circuits 53 connected to the four memory cell array blocks 50 are connected to the same one of the write data buses RD1 to RD4, respectively.

In the present embodiment, one of the four memory cell array blocks 50 is selected by two bits of address signals A. The sense amplifiers 52 connected to the selected memory cell array block 50 are activated, and outputs of the sense amplifiers 52 connected to the other memory cell array blocks 50 enter a high impedance state.

Figure 16:
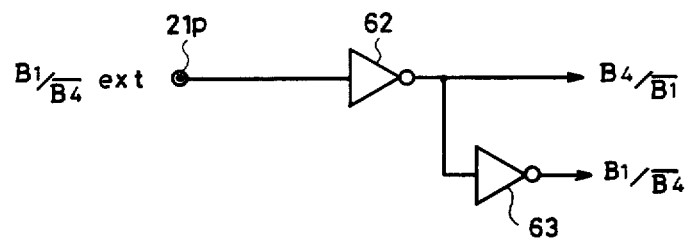
FIG. 16 is a circuit diagram showing an example of a switching signal generating circuit.

FIG. 16 is a diagram showing an example of a switching signal generating circuit.

The switching signal generating circuit comprises two inverters 62 and 63. A switching signal B1/$\overline{B4}$ applied to a pad 21p is inverted by the inverter 62 to be an inverted switching signal B4/$\overline{B1}$, and further inverted by the inverter 63 to be a switching signal B1/$\overline{B4}$. The pad 21p is connected to a pin 21 in a package by a bonding wire.

The circuit allows the word organization to be changed by a signal externally applied to the pin 21.

Figure 17:
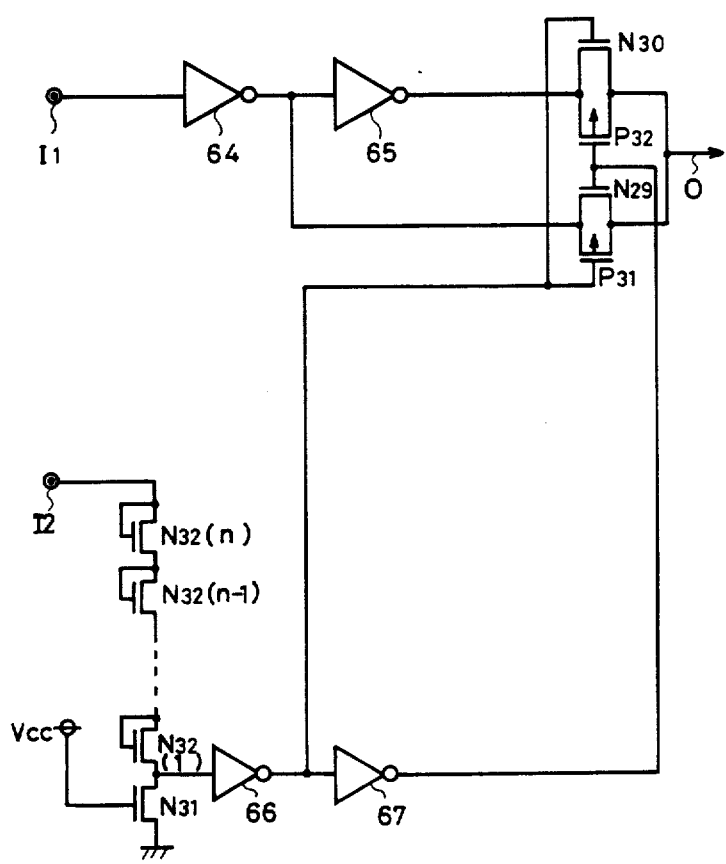
FIG. 17 is a circuit diagram showing another example of the switching signal generating circuit.

FIG. 17 is a diagram showing another example of the switching signal generating circuit.

The switching signal generating circuit comprises inverters 64, 65, 66 and 67, n channel transistors N29 to N31, N32(1) to N32(n) and p channel transistors P31 and P32. An input terminal I1 is coupled to a power-supply potential $V_{CC}$ or a ground potential $V_{SS}$ by a bonding wire when a chip is assembled. An input terminal I2 is generally opened.

An input of the inverter 66 attains an "L" level, an output of the inverter 66 attains an "H" level and an output of the inverter 67 attains the "L" level, since the transistor N31 is turned on. Thus, the transistors N30 and P32 are turned on and the transistors N29 and P31 are turned off. Therefore, for example, when the input terminal I1 is coupled to the power-supply potential $V_{SS}$, an output node o attains the "L" level.

When a high voltage is applied to the input terminal I2, the input of the inverter 66 attains the "H" level, the output of the inverter 66 attains the "L" level and the output of the inverter 67 attains the "H" level. Thus, the transistors N29 and P31 are turned on and the transistors N30 and P32 are turned off. Therefore, the output node o attains the "H" level. Thus, a potential of the output node o of the circuit is generally fixed at the "L" level and inverted into the "H" level by applying a high voltage to the input terminal I2.

When the input terminal I2 in the circuit shown in FIG. 17 is connected to a pin in a package and the output node o in the circuit is connected to the pad 21p in the circuit shown in FIG. 16, a connection is fixed in either the ×1 organization or the ×4 organization depending on bonding when the above described pin is opened, so that the word organization can be switched by applying the above described pin to a high voltage.

Figure 18:
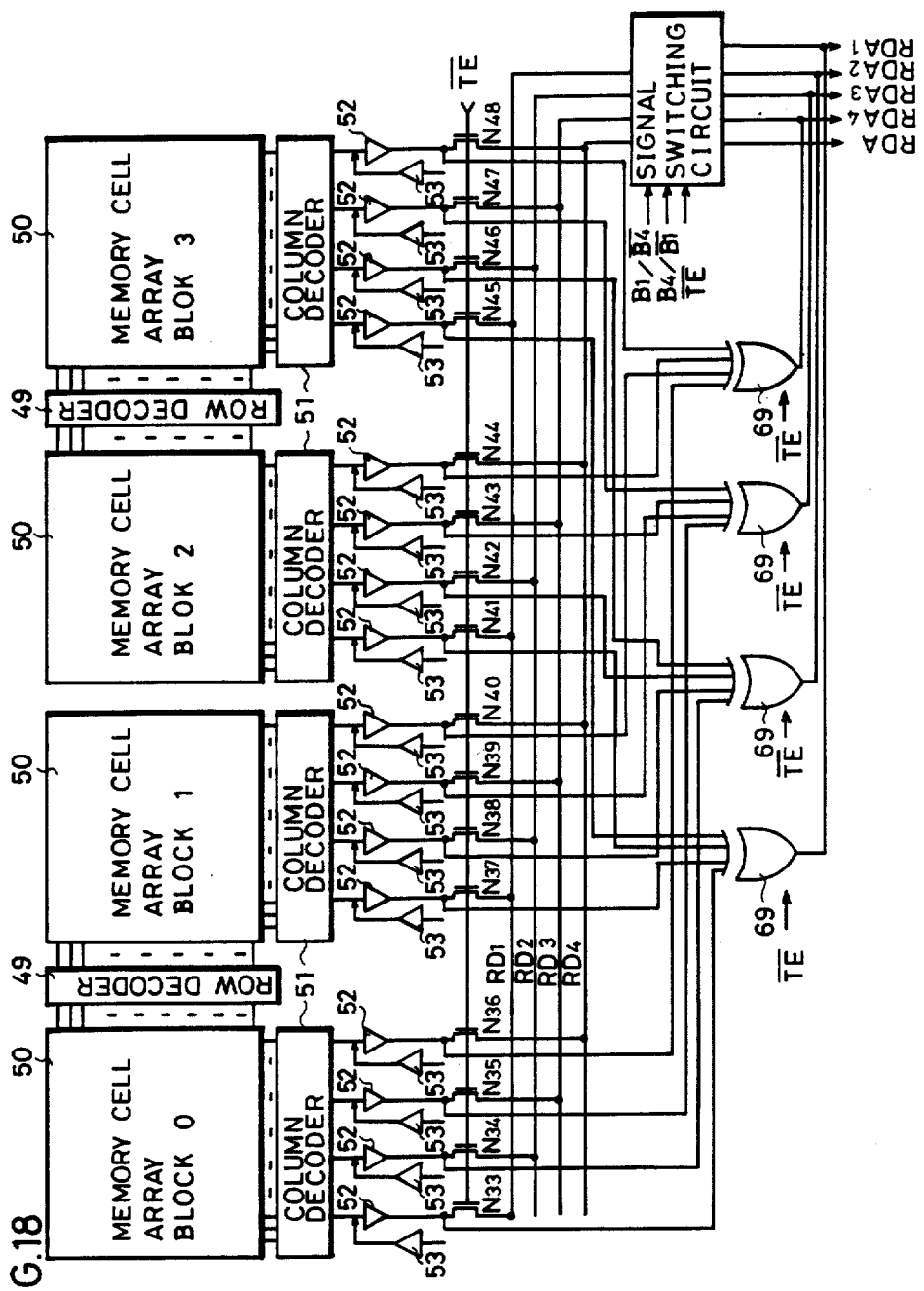
FIG. 18 is a block diagram showing a structure of an internal circuit having a test mode function of a semiconductor memory device according to still another embodiment of the present invention.

FIG. 18 is a block diagram showing a semiconductor memory device according to still another embodiment of the present invention.

The present embodiment is different from the embodiment shown in FIG. 15 with respect to the following. Corresponding four sense amplifiers of sense amplifiers 52 connected to four memory cell array blocks 50 are provided with a common exclusive OR (XOR) circuit 69. Outputs of corresponding four sense amplifiers of the sense amplifiers 52 connected to the four memory cell array blocks 50 are inputted to different input terminals of the same XOR circuit 69. Outputs of the four XOR circuits 69 are connected to read data buses RDA1 to RDA4, respectively. The XOR circuits 69 are switched to an active state and an inactive state by a test enable signal $\overline{TE}$. In addition, n channel transistors N33 to N48 are connected between the sense amplifiers 52 and read data buses RD1 to RD4. The transistors N33 to N48 have respective gates receiving the common test enable signal $\overline{TE}$. Furthermore, the test enable signal $\overline{TE}$ is applied to a signal switching circuit 68. When the test enable signal $\overline{TE}$ is at an "L" level, an output of the signal switching circuit 68 enters a high impedance state.

The test enable signal $\overline{TE}$ is generally forced to be an "H" level. In this case, the signal switching circuit 68 is operated, so that all of the transistors N33 to N48 are turned on and all of the outputs of the XOR circuits 69 enter the high impedance state. The operation at that time is the same as that in the embodiment shown in Fig. 15.

When the test enable signal $\overline{TE}$ is forced to be the "L" level, the output of the signal switching circuit 68 enters the high impedance state and all of the transistors N33 to N48 are turned off, so that the output of each of the sense amplifiers 52 connected to each of the memory cell array blocks 50 is inputted to each of the XOR circuits 69.

According to the present embodiment, the same data are written to the four memory cell array blocks 50 and read out through the sense amplifiers 53, and it is determined by the XOR circuits 69 whether or not the data read out are the same, whereby the four memory cell array blocks 50 can be simultaneously tested.

Therefore, a function for switching between a ×1 organization and a ×4 organization and the test mode are simultaneously employed, so that the semiconductor memory device with a 1M word by 1 bit organization can be tested in the time period equivalent to that of the semiconductor memory device with a 64K word by 4 bit organization. As a result, the test time period can be significantly reduced to 1/16 to 1/256.

Figure 19:
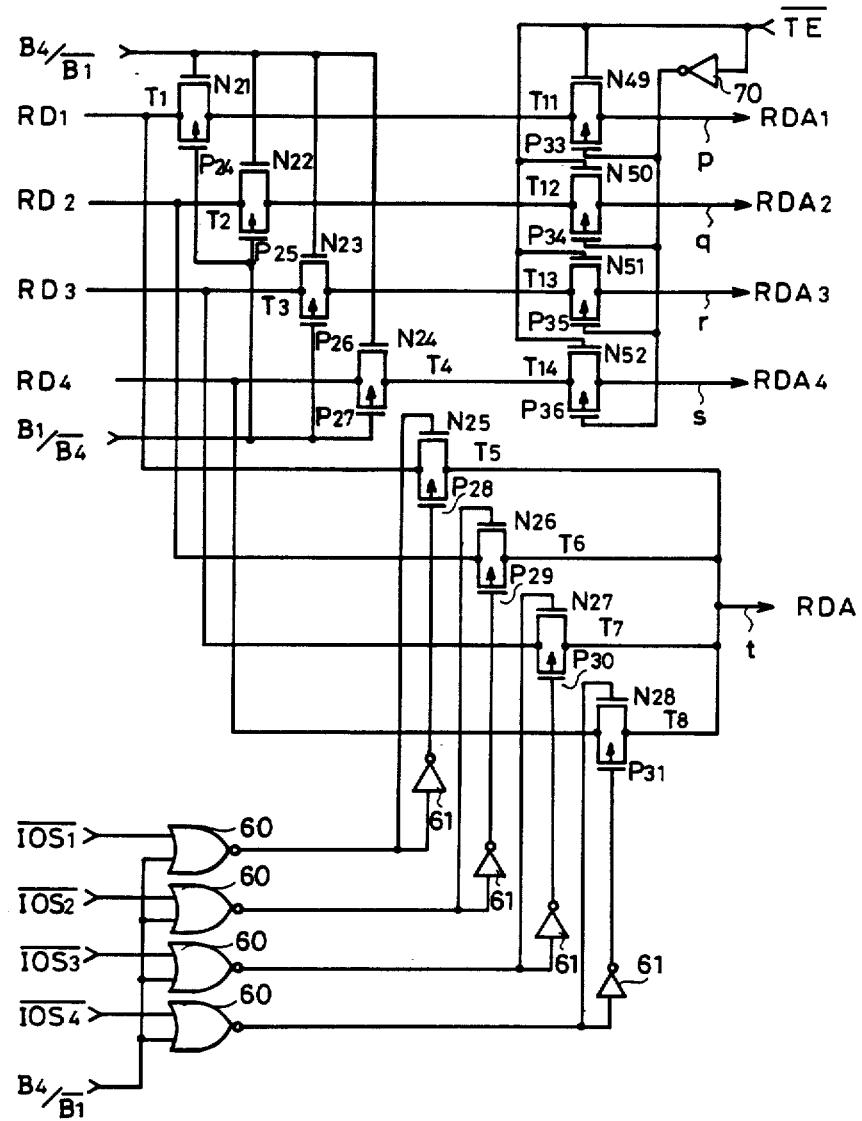
FIG. 19 is a circuit diagram of a signal switching circuit shown in FIG. 18.

FIG. 19 is a circuit diagram showing a structure of the signal switching circuit 68 shown in FIG. 18.

The signal switching circuit 68 is the same as the signal switching circuit 54 shown in FIG. 14 except that transfer gates T11 to T14 comprising p channel transistors P33 to P36 and n channel transistors N49 to N52 are connected between transfer gates T1 to T4 and read data buses RDA1 to RDA4. Each of the transfer gates T11 to T14 has one gate receiving a test enable signal $\overline{TE}$ and other gate receiving an inverted signal of the test enable signal $\overline{TE}$ by an inverter 70. When the test enable signal $\overline{TE}$ is at an "H" level, the transistors N49 to N52 and the transistors P33 to P36 are turned on, so that the transfer gates T11 to T14 are rendered conductive. On the other hand, when the test enable signal $\overline{TE}$ is at an "L" level, the transistors N49 to N52 and the transistor P33 to P36 are turned off, so that output nodes p, q, r and s of the transfer gates T11 to T14 enter a high impedance state.

In the semiconductor memory device according to the above described embodiments, data can be written to a memory cell array using the ×4 organization and the data can be read out using the ×1 organization, for example, so that a new function can be provided to an applied equipment using a memory.

Although in the above described embodiments, the word organization can be changed by the switching signal B1/$\overline{B4}$ externally applied to the pin 21 shown in FIG. 6, the pad 21p shown in FIG. 16 may be fixed at a power-supply potential $V_{CC}$ or a ground potential $V_{SS}$ by bonding at the time of assembling a chip. In this case, the semiconductor memory device is shipped as a device in which the word organization can not be changed. However, the word organization is switched and tested at the test time before shipment of products, so that the test time period can be reduced.

In addition, although in the above described embodiments, it is assumed that two devices having different word organizations require packages having the same number of pins, the devices may require packages having the different number of pins, in which case the same effect can be obtained in a test step before assembly time.

Although in the above described embodiments, a description was made of a case in which the word organization can be switched to the ×1 organization and the ×4 organization, it is not intended to be limited. For example, the word organization may be switched to a ×8 organization and a ×9 organization or to the ×1 organization, the ×4 organization and the ×8 organization, in which case the same effect as the above described embodiments can be obtained. In the case of ×9 organization, 8 bits are used as data bits and 1 bit is used as a parity bit.

Furthermore, although the above described embodiments was described as employing an RAM having 1M bits, an RAM having the other storage capacity may be employed, in which case the same effect can be obtained.

Additionally, although the above described embodiments was described as employing a static RAM, it is not intended to be limited. For example, another memory device such as a dynamic RAM and an ROM may be employed, in which case the same effect can be obtained.

According to the present invention, a semiconductor memory device having a changeable word organization is provided.

In addition, a semiconductor memory device having a word organization that can be changed without requiring additional masking steps for providing the different organizations is provided.

Furthermore, a semiconductor memory device that is operable selectively with different word organizations depending upon particular circuit applications of the memory is provided.

Furthermore, a semiconductor memory device that is operable selectively with one word organization for a particular circuit application and with another organization for testing is provided.

Additionally, a semiconductor memory device operable with different word organizations that requires no additional manufacturing steps is provided.

Furthermore, the test time of memory circuit arrays is reduced.

Furthermore, the number of different kinds of integrated circuit chips that must be maintained in inventory as a result of different word organization requirements is reduced.

In addition, the time required to test a semiconductor memory device without requiring additional pins for testing is reduced.

Furthermore, semiconductor memory devices having different word organizations but virtually identical operating characteristics is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor chip;
   a plurality of terminals formed on said chip for receiving or generating data and address signals,
   said memory device operable selectively in a first word organization mode defined by a first predetermined arrangement of functions of said terminals together with a first word length and in a second word organization mode comprising a test mode defined by a second predetermined arrangement of functions of said terminals together with a second word length different from the first word length;
   means for receiving a word organization mode selection signal; and
   signal flow path control circuitry on said chip and responsive to said word organization mode selection signal for operating said chip, selectively, in said first or second word organization mode.

2. A method of operating a semiconductor memory device, comprising:
   a semiconductor chip;
   a plurality of terminals formed on said chip for receiving or generating data and address signals,
   said memory device operable selectively in a first word organization mode defined by a first predetermined arrangement of functions of said terminals together with a first word length and in a second word organization mode defined by a second predetermined arrangement of functions of said terminals together with a second word length longer than said first word length;
   means for receiving a word organization mode selection signal; and signal flow path control circuitry on said chip and responsive to said word organization mode selection signal for operating said chip, selectively, in said first or second word organization mode, wherein said semiconductor memory device is operable in normal and testing modes of operation;

said operating method comprising the steps of:

during said normal mode of operation of said semiconductor device, generating a first word organization mode selection signal corresponding to said first word length;

during said testing mode of operation of said semiconductor device, generating a second word organization mode selection signal corresponding to said second word length; and applying said first or second word organization mode selection signal so generated to said word organization mode selection signal receiving means.

3. A semiconductor memory device comprising:

a semiconductor chip, a plurality of memory cells formed on said semiconductor chip, a plurality of terminals formed on said semiconductor chip and receiving data and address signals, first processing means formed on said semiconductor chip and having the first number of address input portions receiving the address signals through some of said plurality of terminals and the second number of data receiving portions receiving the data, and responsive to the address signals applied to said address input portions for selecting said second number of memory cells, of said plurality of memory cells and writing the data applied to said data receiving portions to the selected memory cells or reading out the data stored in the selected memory cells o said data receiving portions, second processing means formed on said semiconductor chip and having the third number of address input portions receiving the address signals through some of said plurality of terminals and the fourth number of data receiving portions receiving the data, and responsive to the address signals applied to said address input portions for selecting said fourth number of memory cells, of said plurality of memory cells and writing the data applied to said data receiving portions to the selected memory cells or reading out the data stored in the selected memory cells to said data receiving portions, switching signal generating means formed on said semiconductor chip for generating a switching signal, and signal switching means formed on said semiconductor chip and responsive to a first state of said switching signal generated by said switching signal generating means for coupling said address input portions and said data receiving portions in said first processing means to predetermined terminals, of said plurality of terminals, and responsive to a second state of said switching signal generated by said switching signal generating means for coupling said address input portions and said data receiving portions in said second processing means to a predetermined terminal, of said plurality of terminals.

4. A semiconductor memory device according to claim 3, which further comprises a package on which said semiconductor chip is mounted, said package comprising a plurality of external terminals, each of said terminals formed on said semiconductor chip being connected to any of said plurality of external terminals by a bonding wire.

5. A semiconductor memory device according to claim 4, wherein said package further comprises an external terminal for a switching signal connected to said switching signal generating means by the bonding wire, said switching signal generating means being responsive to a signal applied to said external terminal for a switching signal for generating said switching signal.

6. A semiconductor memory device according to claim 4, which further comprises a signal terminal receiving a signal fixed at a low logical level or a high logical level, said switching signal generating means being connected to said signal terminal by the bonding wire, said switching signal generated by said switching signal generating means being fixed at a logical level corresponding to the logical level of said signal terminal.

7. A semiconductor memory device according to claim 6, which further comprises a switching signal terminal coupled to said switching signal generating means by the bonding wire, the logical level of said switching signal generated from said switching signal generating means being able to be changed by applying a signal at a predetermined level to said switching signal terminal.

8. A semiconductor memory device according to claim 3, wherein said plurality of memory cells are divided into a plurality of blocks, and which further comprises means responsive to said address signals applied to some of said plurality of terminals for selecting simultaneously a predetermined number of memory cells in each of said blocks and simultaneously writing the same data applied to some of said plurality of terminals to a memory cell selected in each of the blocks, and responsive to said address signals applied to some of said plurality of terminals for simultaneously selecting a predetermined number of memory cells in each of said blocks, simultaneously reading out the data from the selected memory cells, and determining whether or not the plurality of data read out have a predetermined logical relation.

9. A semiconductor memory device according to claim 3, wherein storage capacity comprising said plurality of memory cells is more than 1M bits.

10. A semiconductor memory device according to claim 3, wherein said second number is 1 and said fourth number is 4.

11. A semiconductor memory device according to claim 3, wherein each of said plurality of memory cells comprises a static memory cell.

* * * * *